United States Patent [19]

Fujimaki

[11] Patent Number: 5,602,061
[45] Date of Patent: Feb. 11, 1997

[54] PROCESS AND APPARATUS FOR MANUFACTURING MOS DEVICE

[75] Inventor: Nobuyoshi Fujimaki, Tokyo, Japan

[73] Assignee: Shin-Etsu Handotai Co., Ltd., Tokyo, Japan

[21] Appl. No.: 167,031

[22] Filed: Dec. 16, 1993

[30] Foreign Application Priority Data

Dec. 17, 1992 [JP] Japan .................................. 4-355269

[51] Int. Cl.$^6$ .................................................. H01L 21/316
[52] U.S. Cl. ........................... 437/239; 437/235; 437/247
[58] Field of Search .................................. 437/239, 98.3, 437/247, 409 S, 419 S, 42, 235, 238; 257/405; 148/DIG. 118

[56] References Cited

U.S. PATENT DOCUMENTS

| | | | |
|---|---|---|---|
| 4,139,658 | 2/1979 | Cohen et al. | 427/93 |
| 4,275,094 | 6/1981 | Takagi et al. | 437/239 |
| 4,293,590 | 10/1981 | Takagi et al. | 437/239 |
| 4,376,796 | 3/1983 | Arrasmith et al. | 437/239 |
| 4,377,605 | 3/1983 | Yamamoto | 437/239 |
| 4,599,247 | 7/1986 | Bean et al. | 434/239 |
| 5,057,463 | 10/1991 | Bryant et al. | 437/239 |
| 5,314,846 | 5/1994 | Boitnott | 437/239 |

FOREIGN PATENT DOCUMENTS

| | | | |
|---|---|---|---|
| 0031671 | 7/1981 | European Pat. Off. | |
| 3142548 | 5/1983 | Germany. | |
| 61023757 | 1/1986 | Japan. | |
| 61-8931 | 1/1986 | Japan | 437/239 |
| 3224228 | 3/1991 | Japan. | |

OTHER PUBLICATIONS

Institute of Environmental Sciences, "Contamination Control, Computer Applications—CC–related", *1992 Proceedings*, vol. 1, pp. 352–361, May 1992.

Ara Philipossian et al., "Nonideal Flow Behavior Analysis of Atmospheric Thermal Silicon Oxidation Reactors by the Residence Time Distribution Technique", *Journal of the Electrochemical Society*, vol. 138, No. 8, pp. 2451–2459, Aug. 1991.

V. Nayar et al., "Optimisation of Furnace Oxidation of Si With Respect to Negative Bias Stress Instability", *Microelectric Engineering*, vol. 22, pp. 47–50, 1993.

S. P. Tray et al., "Thin Gate and Poly Oxides by High Pressure Silicon Oxidation", 1046 *Journal of the Electrochemical Society*, No. 6, pp. 1484–1488, Jun. 1987.

Bruce E. Deal, "Standardized Terminology for Oxide Charges Associated With Thermally Oxidized Silicon", *IEEE Transactions on Electron Devices*, vol. ED–27, No. 3, Mar. 1980, pp. 606–608.

Bruce E. Deal et al., "Characteristics of the Surface–State Charge ($Q_{ss}$) of Thermally Oxidized Silicon", *J. Electrochem. Soc.: SOLID STATE SCIENCE*, Mar. 1967, pp. 266–273.

F. Montillo et al., "High–Temperature Annealing of Oxidized Silicon Surfaces", *Growth of Semiconductor Superlattice*, vol. 118, No. 9, pp. 1463–1468.

*Primary Examiner*—Tom Thomas
*Assistant Examiner*—S. Mulpuri
*Attorney, Agent, or Firm*—Oliff & Berridge

[57] ABSTRACT

A process and apparatus for manufacturing MOS devices are disclosed. The process comprises the step of controlling a first clearance linear speeds (1st CLSs) X which is the flows of an oxidizing and an annealing gases defined as ratios of the flow rates thereof to the area of a clearance between a semiconductor wafer and the interior surface of the tube of a heat treating furnace to be at least 30 cm/min while the semiconductor wafer is oxidized and annealed. The process comprises the step of controlling a second clearance linear speed (2nd CLS) Y which is a flow of the annealing gas defined as a ratio of the flow rate thereof to the area of the clearance to be at least 100 cm/min while the semiconductor wafer is taken out of the tube. The process comprises the step of controlling a relation between the 1st CLSs X and the 2nd CLS Y so that $Y \geq -2.5 X + 275$. The process and the apparatus reduce and control the fixed-charge density in the oxide film of a MOS device with a high repeatability.

16 Claims, 5 Drawing Sheets

PROCESS AND APPARATUS FOR MANUFACTURING MOS DEVICE

BACKGROUND OF THE INVENTION

1. Field of the Invention

The present invention relates to a process and an apparatus for manufacturing MOS devices from semiconductor (e.g. silicon) wafers.

2. Description of the Related Art

The thermal oxidation is one of processes for growing a silicon oxide film on a surface of a silicon wafer. For example, the field oxide film growth of the thermal oxidation employs the so-called high-temperature oxidation in which an oxidizing agent, such as oxygen ($O_2$) or a steam ($H_2O$), is fed into a quartz tube and heated at the high temperature of 1100° C. to grow a silicon oxide on the surface of the silicon wafer. Recently, a thin oxide film such as a gate oxide occasionally employs an oxidation at a low temperature of 800°–900° C. and/or in the diluted oxidizing gas reducing an oxidation rate in order to unify the in-plane thickness of the oxide film on the silicon wafer.

Oxide films grown by such processes include electric charges such as the fixed charge. It is known that these charges vary the surface potential of the silicon and especially cause important problems in the yield and the reliability of a MOS device. Hitherto, many researches have been on the oxide charges (see IEEE. TRANSACTIONS ON ELECTRON DEVICES, VOL. ED-27, NO.3, MARCH 1980, pp.606–608).

It has been known that the charge density decreases when an oxidation temperature increases and the charge density further decreases when the oxidized silicon wafer is annealed in an ambient of an inert gas such as argon or nitrogen (see J. Electrochem. Soc: SOLID-STATE SCIENCE AND TECHNOLOGY, March 1967, pp.266–273). It has been known in a subsequent research that the charge density increases by the presence of dry oxygen in the inert gas (see J. Electrochem. Soc: SOLID-STATE SCIENCE AND TECHNOLOGY, September 1971, pp.1463–1468).

The present inventor discovered in a test that fixed-charge densities are not equal when silicon oxide films are grown on silicon wafers in cylindrical tubes of heat treating furnaces with different bores under the same heat treatment conditions.

In the test, 27 silicon wafers sliced from a silicon single crystal grown by the Czochralski method were prepared. Each silicon wafer was a 4-inch diameter, the <100> orientation, the p-type conduction and a 10-Ωcm resistivity. All of the silicon wafers were cleaned and dried up. Subsequently, respective nine sets of three silicon wafers were put in nine horizontal heat treating furnaces A, B, C, D, E, F, G, H and I with different bores. Each set of three silicon wafers were placed at 1000° C. in the ambient of a wet oxygen at a flow rate of 5 l/min for 1.5 hr and a gate oxide of a 500-nm thickness was grown on each silicon wafer. Successively, these three silicon wafers were annealed in the ambient of nitrogen at a flow rate of 5 l/min for 1 hr, respectively. Subsequently, an aluminum electrode was deposited on the gate oxide using shadow mask by a vacuum evaporator. Subsequently, the oxide of back surface was removed. Subsequently, in order to reduce the interface trap density, all the silicon wafers were heat treated at 400° C. in the ambient of a mixture gas of 3% hydrogen and 97% nitrogen for 30 min. Thus, many MOS capacitors with 1.81 mm² gate area were fabricated. The capacitance versus voltage (C-V) characteristics of each MOS capacitor were measured and fixed-charge densities at six points of that MOS capacitor of each silicon wafer were obtained. An average of the fixed-charge densities at the six points was determined as the data of each silicon wafer.

Figure 6:
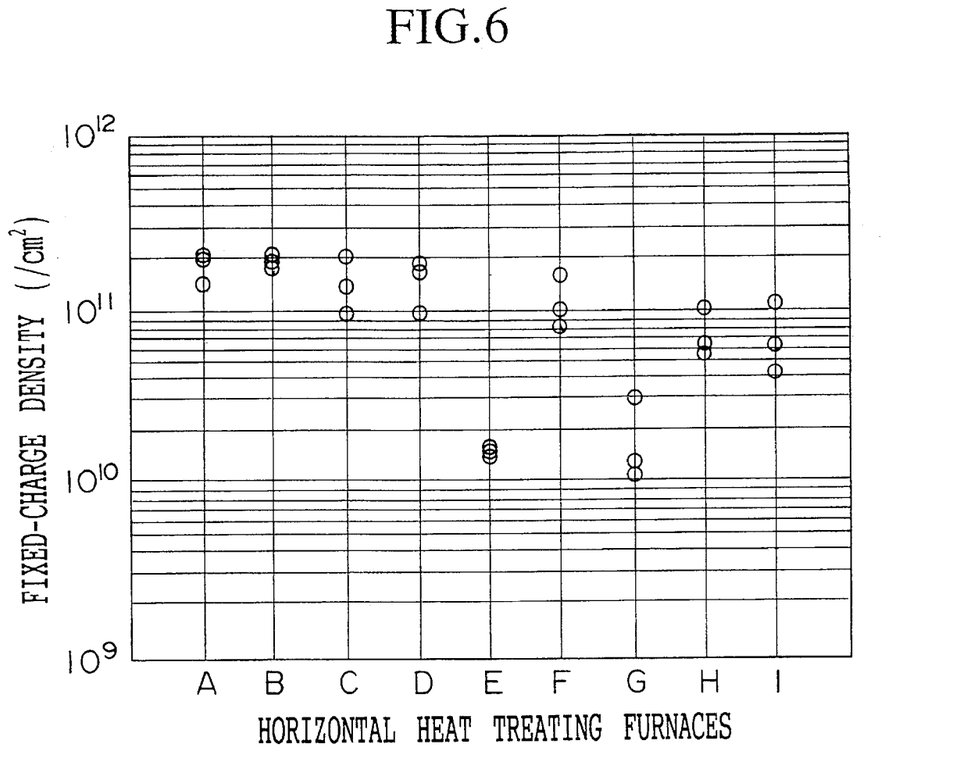
FIG. 6 shows a relation between nine tubes of the heat treating furnaces with different bores and fixed-charge densities under the condition of the test for the prior art.

FIG. 6 shows a relation between nine horizontal heat treating furnaces with different bores and fixed-charge densities. As seen in FIG. 6, fixed-charge densities are not equal among the nine furnaces under the same heat treatment condition.

It will become greatly important that the charge density is controled in order to fabricate a microscopic device, a high density assembly device and a high speed device of integrated circuits. To this end, it will be necessary for the controlling technique not only to reduce the fixed-charge density but also to apply commonly for the heat treating furnaces with different bores.

Figure 2:
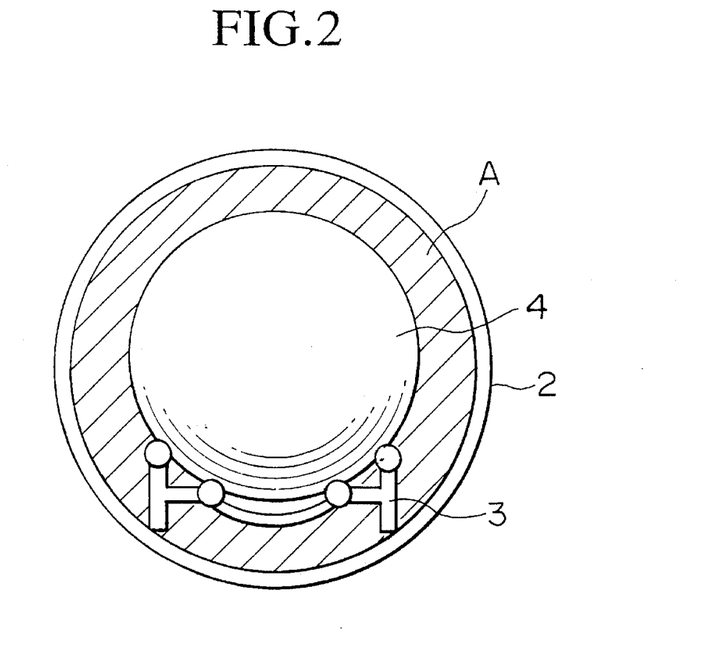
FIG. 2 shows a cross-sectional view taken along Line II—II in FIG. 1.

In view of the requirements described above, the inventor variously tested under different heat treatment conditions using heat treating furnaces with different bores and discovered that the fixed-charge density strongly depends on the flow rate of an ambient gas. In a subsequent test, the inventor also discovered that the fixed-charge density depended on the clearance linear speed (CLS) which was defined as a ratio of the flow rate of an ambient gas to the area of a clearance between a silicon wafer and the interior surface of the tube, as seen in FIG. 2. Moreover, the inventor discovered that, when the CLS was constant, fixed-charge densities were substantially equal even though silicon oxide films were grown by the heat treating furnaces with different bores.

SUMMARY OF THE INVENTION

The present invention was made in view of the discovery.

An object of the present invention is to provide a process and an apparatus for manufacturing MOS devices from substantially disc-shaped semiconductor (e.g. silicon) wafers which are effectively reduced and controled the fixed-charge density in the oxide film of the MOS devices with a high repeatability.

In order to achieve this object, a first aspect of the present invention comprises the step of providing a horizontal heat treating furnace.

The furnace includes a horizontal cylindrical quartz tube with opposite open ends, means for holding the semiconductor wafer in a vertical position transverse against the longitudinal axis of the tube, and a gas feed system connected to one open end of the tube. The gas feed system feeds a flow of an oxidizing gas into the quartz tube at an oxidizing step. The gas feed system further feeds a flow of an annealing gas to the oxidized semiconductor wafer at an annealing step. The furnace further includes means removably mounted to the other open end for closing it. The closing means in a mounted position allows a gas in the tube to flow outside the tube and on the other hand, in a removed position allows the semiconductor wafer to be put into and taken out of the tube. The first aspect of the present invention further comprises the step of controlling a first clearance linear speeds (1st CLSs) X which is the flows of the oxidizing and annealing gases defined as ratios of those flow rates to the area of a clearance between the semiconductor wafer and the interior surface of the tube to be at least 30 cm/min at the oxidizing and annealing steps. The first aspect of the present invention further comprises the step of controlling a second clearance linear speed (2nd CLS) Y which is the flow of the annealing gas defined as a ratio of that flow rate to the area of said clearance to be at least 100 cm/min during (or throughout the duration of) the step of taking the semiconductor wafer out of the tube. The first aspect of the present invention further comprises the step of controlling a relation between the 1st CLSs X and the 2nd CLS Y so that $Y \geq -2.5 X + 275$.

In the first aspect of the present invention, the first control step may comprise the steps of controlling the flow rate of the oxidizing gas by means of the gas feed system to control the 1st CLS X of the oxidizing gas and controlling the flow rate of the annealing gas by means of the gas feed system to control the 1st CLS X of the annealing gas. The second control step may comprise a step of controlling the flow rate of the annealing gas by means of the gas feed system to control the 2nd CLS Y.

In the first aspect of the present invention, the first and second control steps may comprise a step of mounting a substantially disc-shaped dummy wafer whose diameter is not smaller than the diameter of the semiconductor wafer to the holding means in a vertical position transverse against the longitudinal axis of the tube.

A second aspect of the present invention comprises (a) a horizontal heat treating furnace. The furnace includes a horizontal cylindrical tube with opposite open ends, means for holding the semiconductor wafer in a vertical position transverse against the longitudinal axis of the tube, and a gas feed system connected to one end of the tube. The gas feed system feeds a flow of an oxidizing gas into the quartz tube at an oxidizing step. The gas feed system further feeds a flow of an annealing gas to the oxidized semiconductor wafer at an annealing step. The furnace further includes means removably mounted to the other end for closing it. The closing means in a mounted position allows a gas in the tube to flow outside the tube and on the other hand, in a removed position allows the semiconductor wafer to be put into and taken out of the tube. The second aspect of the present invention further comprises (b) a sensor detecting the flow rate of the oxidizing gas in a clearance between the semiconductor wafer and the interior surface of the tube and producing a first flow rate signal at the oxidizing step. The sensor further detects the flow rate of the annealing gas in said clearance and producing a second flow rate signal at the annealing step. The sensor further detects the flow rate of the annealing gas in the clearance and producing a third flow rate signal during the step of taking the semiconductor wafer out of the tube. The second aspect of the present invention further comprises (c) means responsive to the first and second flow rate signals for controlling the 1st CLSs X to be at least 30 cm/min. The second aspect of the present invention further comprises (d) means responsive to the third flow rate signal for controlling the 2nd CLS Y to be at least 100 cm/min. The second aspect of the present invention further comprises (e) means for controlling a relation between the 1st CLSs X and the 2nd CLS Y so that $Y \geq -2.5 X + 275$.

In the second aspect of the present invention, the means for controlling the 1st CLSs X and the means for controlling the 2nd CLS Y may comprise means mounted in the gas feed system for controlling the flow rates of the oxidizing and annealing gases.

In the second aspect of the present invention, the means for controlling the 1st CLSs X and the means for controlling the 2nd CLS Y may comprise a substantially disc-shaped dummy wafer whose diameter is not smaller than the diameter of the semiconductor wafer and mounted to the holding means in a vertical position transverse against the longitudinal axis of the tube.

In the first and second aspects of the present invention, the oxidizing gas may comprise wet or dry oxygen and the annealing gas may comprise nitrogen and/or argon.

A third aspect of the present invention comprises the step of providing a horizontal heat treating furnace. The furnace includes a horizontal cylindrical tube with opposite open ends, means mounted within the tube for holding the semiconductor wafer in a vertical position transverse against the longitudinal axis of the tube, and a gas feed system connected to one open end of the tube. The gas feed system feeds a flow of an oxidizing gas into the tube at an oxidizing step to produce an oxidizing ambient. The gas feed system further feeds a flow of an annealing gas to the oxidized semiconductor wafer at an annealing step to produce an annealing ambient. The furnace includes means removably mounted to the other open end of the tube for closing it. The closing means in a mounted position allows a gas in the tube to flow outside the tube and on the other hand, in a removed position allows the semiconductor wafer to be put into and taken out of the tube. The third aspect of the present invention further comprises the steps of controlling the 1st CLSs X and the 2nd CLS Y to be fixed and a relation between the 1st CLSs X and the 2nd CLS Y so as to exist in a predetermined range.

A fourth aspect of the present invention comprises the step of providing a vertical heat treating furnace. The furnace includes a vertical cylindrical tube with upper and lower open ends, means for holding the semiconductor wafer in a horizontal position transverse against the longitudinal axis of the tube, and a gas feed system connected to the upper open end of the tube. The gas feed system feeds a flow of an oxidizing gas into the tube at an oxidizing step to produce an oxidizing ambient. The gas feed system further feeds a flow of an annealing gas to the oxidized semiconductor wafer at an annealing step to produce an annealing ambient. The furnace further includes means removably mounted to the other open end of the tube for closing it. The closing means in a mounted position allows a gas in the tube to flow outside the tube and on the other hand, in a removed position allows the semiconductor wafer to be put into and taken out of the tube. The fourth aspect of the present invention further comprises the steps of controlling the 1st CLSs X and the 2nd CLS Y to be fixed and a relation between the 1st CLSs X and the 2nd CLS Y to be fixed.

In the above-mentioned aspects of the present invention, it is possible to provide oxidized semiconductor wafer beforehand.

The oxidizing ambient gas must be turned to an inert gas at the start of the annealing step. When the semiconductor wafer is the silicon wafer, a low CLS of the inert gas inevitably allows the remaining dry oxygen to exist in the furnace for a long time and the remaining dry oxygen diffuses into the $SiO_2$-Si interface of the silicon oxide film and cut the bonding hands of silicon atoms. This process yields excess $Si^{2+}$ and $SiO^+$ in the silicon oxide film near the $SiO_2$-Si interface and results in generating the fixed charge.

In addition, since the closing means (e.g. a quartz cap) is removed off the furnace tube when the annealed silicon wafer is taken out of the tube, the atmospheric air readily makes an invasion into the tube, so that the silicon oxide film is exposed to oxygen of the invasive atmospheric air, which entails the problem described above. However, the present invention effectively prevents the silicon oxide film from being exposed to dry oxygen after the annealing step, in order to reduce the fixed-charge density in the silicon oxide film.

In particular, when the 1st CLSs X of the ambient gases during (or throughout the duration of) the oxidation and the annealing is at least 30 cm/min and the 2nd CLS Y is at least 200 cm/min during the step of taking the silicon wafer out of the tube, the present invention produces a silicon oxide film with a fixed-charge density of $1\times10^{11}/cm^2$ or less. In addition, when the 1st CLSs X of the ambient gases during the steps of the oxidation and annealing are at least 50 cm/min and the 2nd CLS Y is at least 150 cm/min during the step of taking the silicon wafer out of the tube, the present invention produces a silicon oxide film of the fixed-charge density with $1\times10^{11}/cm^2$ or less.

In case of the vertical heat treating furnace, the 1st CLSs X and the 2nd CLS Y will decrease since the atmospheric air does not make an invasion so much in comparison with the horizontal heat treating furnace.

Other objects, features and advantages of the present invention will be apparent from a consideration of the following description, taken in connection with the accompanying drawing.

DETAILED DESCRIPTION OF THE PREFERRED EMBODIMENTS

Embodiments of the present invention will be described with reference to the drawings hereinafter.

Figure 1:
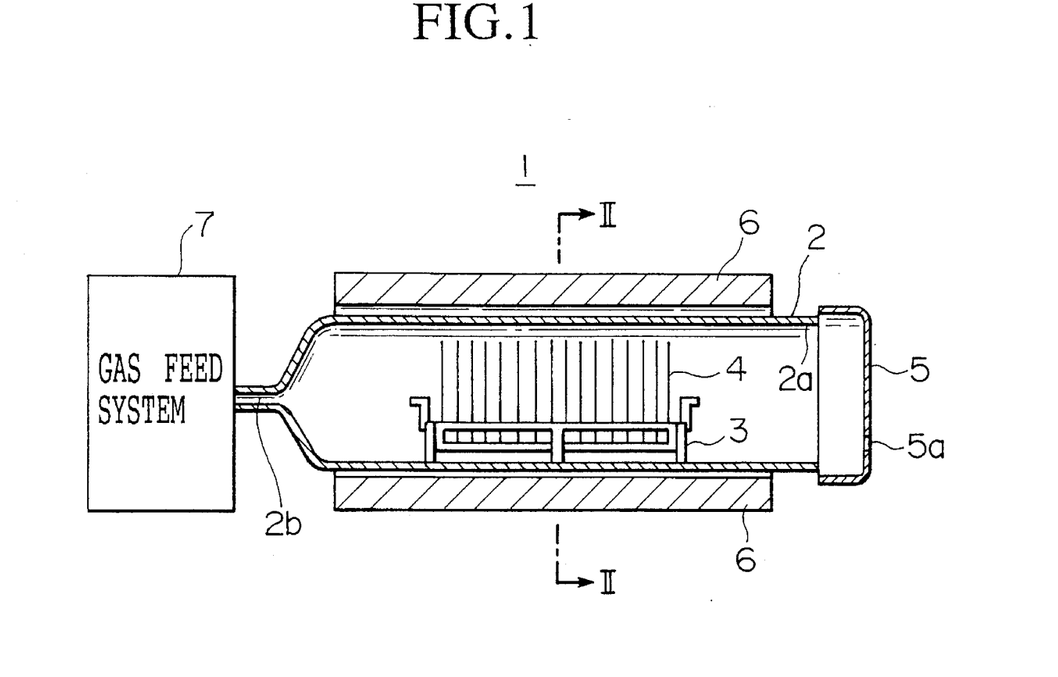
FIG. 1 shows a diagrammatic longitudinal section of a heat treating furnace employed in the present invention.

FIG. 1 diagrammatically shows a longitudinal section of a horizontal heat treating furnace employed in a process for manufacturing MOS devices according to an embodiment of the present invention. The furnace 1 comprises a cylindrical tube 2 of quartz, a boat 3 placed in the tube 2 and retaining multiple silicon wafers 4 in vertical positions transversely against the longitudinal axis of the tube 2, a gas feed system 7 connected to one reduced end 2b of the tube 2a, a quartz cap 5 removably mounted to the other end 2a of the tube 2, a heater 6 surrounding the cylindrical wall of the tube 2. The boat 3 is put into the tube 2 through the one end 2a of the tube 2. The cap 5 has a small through-hole 5a which flows a gas outside the tube 2 and serves to make a gas flow laminar in the tube 2.

As seen by a hatched area A in FIG. 2, a 1st CLS of an ambient gas is defined as a ratio of that flow rate to the area of the clearance between a silicon wafer 4 and the interior surface of the tube 2. More specifically, this clearance is a clearance between a silicon wafer 4 placed at the center of an array of silicon wafers 4 retained by the boat 3 and the interior surface of the tube 2.

Results of test 1 will be described below.

TEST 1

1.1 Purpose

The purpose of the TEST 1 is to investigate a relation between the fixed-charge density and the 2nd CLS Y as a function of the 1st CLSs X.

1.2 Process 48 silicon wafers sliced from a silicon single crystal grown by the Czochralski method were prepared so that each silicon wafer 4 is a 5-inch diameter, the <100> orientation, the p-type conduction and about 10-Ωcm resistivity. Prior to the oxidation, all of the silicon wafers 4 were cleaned and dried up. Subsequently, the cleaned silicon wafers 4 were immediately put into the horizontal heat treating furnaces. Each set of three silicon wafers 4 was heated at 1000° C. in the ambient of a wet oxygen for 1.5 hr. A gate oxide of a 500-nm thickness was grown on each silicon wafer 4. Successively, each set of three silicon wafers 4 was annealed in the ambient of nitrogen for 1 hr.

The 1st CLSs X was respectively selected to be 20, 30, 40, 50 and 70 cm/min by sets of three silicon wafers 4. The 2nd CLS Y was selected to be particular values of 70–400 cm/min by a set of three silicon wafers 4. Subsequently, an aluminum electrode was deposited on each oxide film using a shadow mask by a vacuum evaporator. Subsequently, the oxide of back surface was removed. Subsequently, in order to reduce the interface trap density, all of the silicon wafers 4 were heated at 400° C. in the ambient of a mixture gas of 3% hydrogen and 97% nitrogen for 30 min. Thus, MOS capacitors with 1.81 mm² gate area were fabricated. The C-V characteristics of each MOS capacitor was measured and fixed-charge densities at six points in the MOS capacitor were obtained. An average of the fixed-charge densities at the six points was determined as data of each silicon wafer.

1.3 Results

Figure 3:
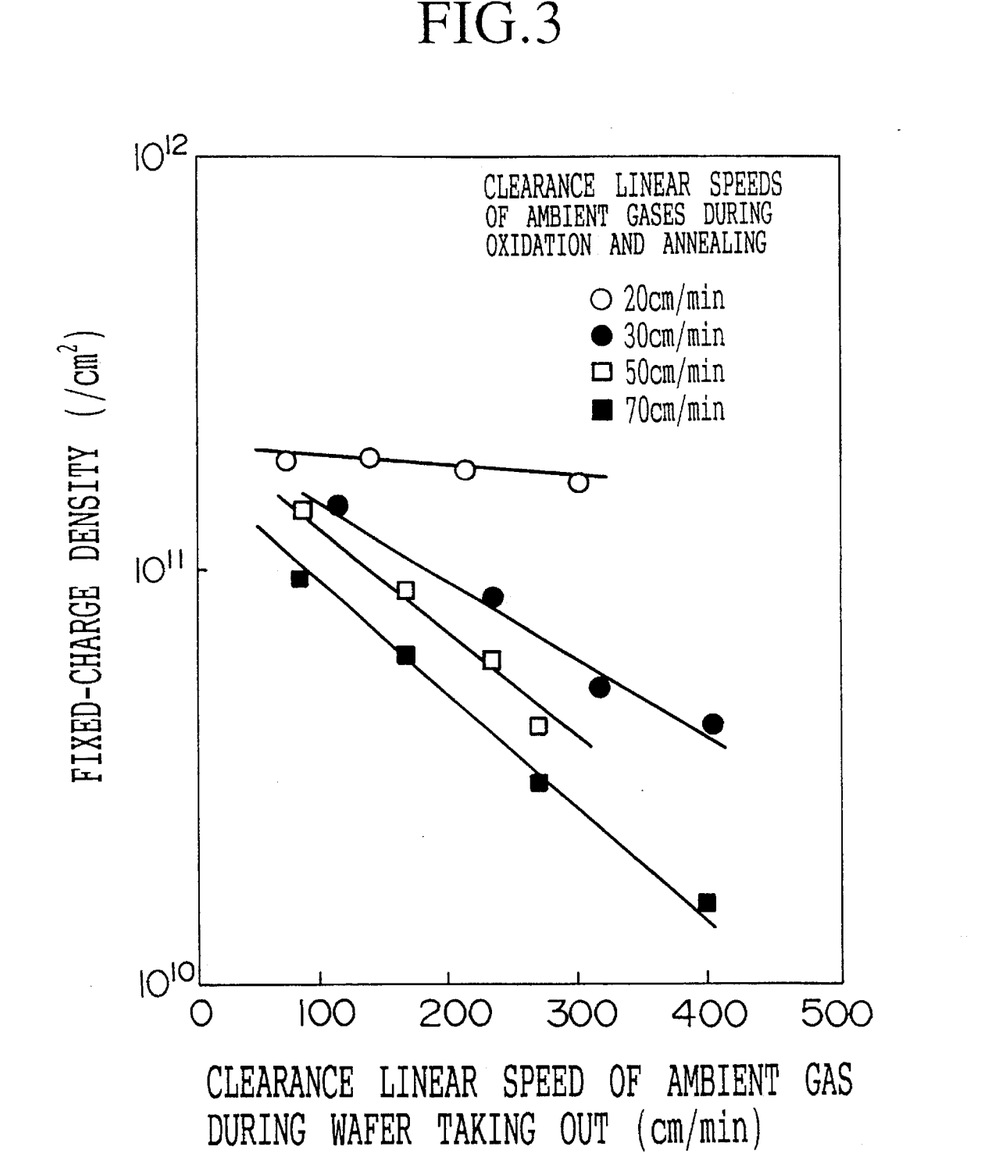
FIG. 3 shows a relation between the 2nd CLS Y and fixed-charge densities as a function of the 1st CLSs X under the condition of TEST 1 using the furnace of FIG. 1.
Figure 4:
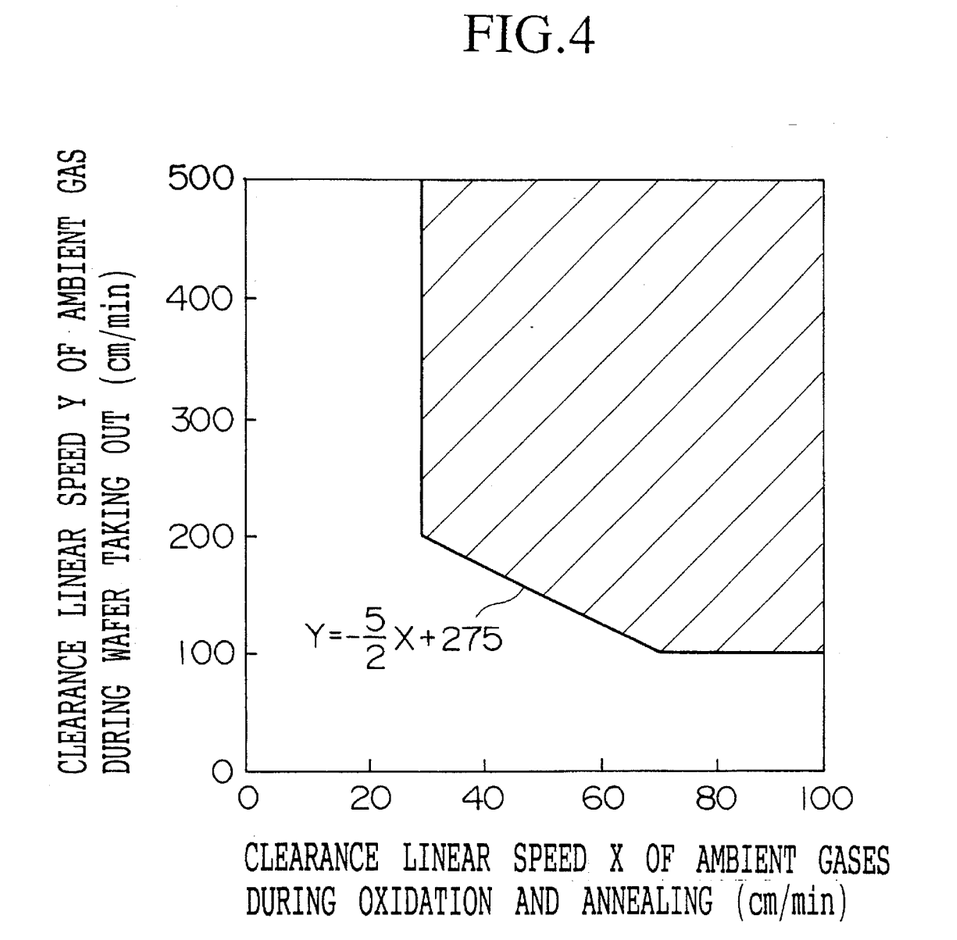
FIG. 4 shows a relation between the 1st CLSs X and the 2nd CLS Y with a hatched region indicating the fixed-charge density of $1\times10^{11}/cm^2$ or less.

FIG. 3 shows a relation among the 1st CLSs X of the ambient gases of the oxidation and the annealing, the 2nd CLSs Y of the ambient gas at the step of taking the silicon wafers 4 out of the tube 2, and the fixed-charge densities in the silicon oxide film. FIG. 4 shows a relation between the 1st CLSs X and the 2nd CLS Y with a hatched region indicating the fixed-charge density of $1\times10^{11}/cm^2$ or less. In FIG. 3, each plot represents an average of the fixed-charge densities of the three silicon wafers 4 with the same heat treatment conditions. In FIG. 4, the hatched region represents the 1st CLSs X and the 2nd CLS Y at which the fixed-charge density is $1\times10^{11}/cm^2$ or less.

FIG. 3 demonstrates that the fixed-charge density decreases as the 1st CLSs X and the 2nd CLS Y increase.

In addition, FIGS. 3 and 4 demonstrate that when the 1st CLSs X is at least 30 cm/min and the 2nd CLS Y is at least 100 cm/min so that Y≧−2.5 X+275, the fixed-charge densities in the silicon oxide film are $1\times10^{11}/cm^2$ or less.

TEST 2

2.1 Purpose

The purpose of the TEST 2 is to investigate the repeatability of the present invention under the condition of the CLSs keeping the fixed-charge density of $1\times10^{11}/cm^2$ or less.

2.2 Process 15 silicon wafers sliced from a silicon single crystal grown by the Czochralski method were prepared so that each silicon wafer 4 is a 5-inch diameter, the <100> orientation, the p-type conduction and about 10-Ωcm resistivity. All of the silicon wafers 4 were cleaned and dried up. Subsequently, five sets of three silicon wafers 4 were immediately placed in five horizontal heat treating furnaces A, C, E, G and H with different bores of the tubes 2. Each set of three silicon wafers 4 was heated at 1000° C. in an ambient of wet oxygen for 1.5 hr. A gate oxide of a 500-nm thickness was grown on each silicon wafer 4. Successively, each set of three silicon wafers 4 was annealed in the ambient of nitrogen for 1 hr.

The 1st CLSs X was 50 cm/min. The 2nd CLS Y was 175 cm/min. Subsequently, MOS capacitors with 1.81 mm$^2$ gate area were fabricated in the same manner as in the TEST 1. The C-V characteristics of each MOS capacitor was measured and fixed-charge densities at six points in the MOS capacitor were obtained. An average of the fixed-charge densities at the six points was determined as the data of each silicon wafer.

2.3 Results

Figure 5:
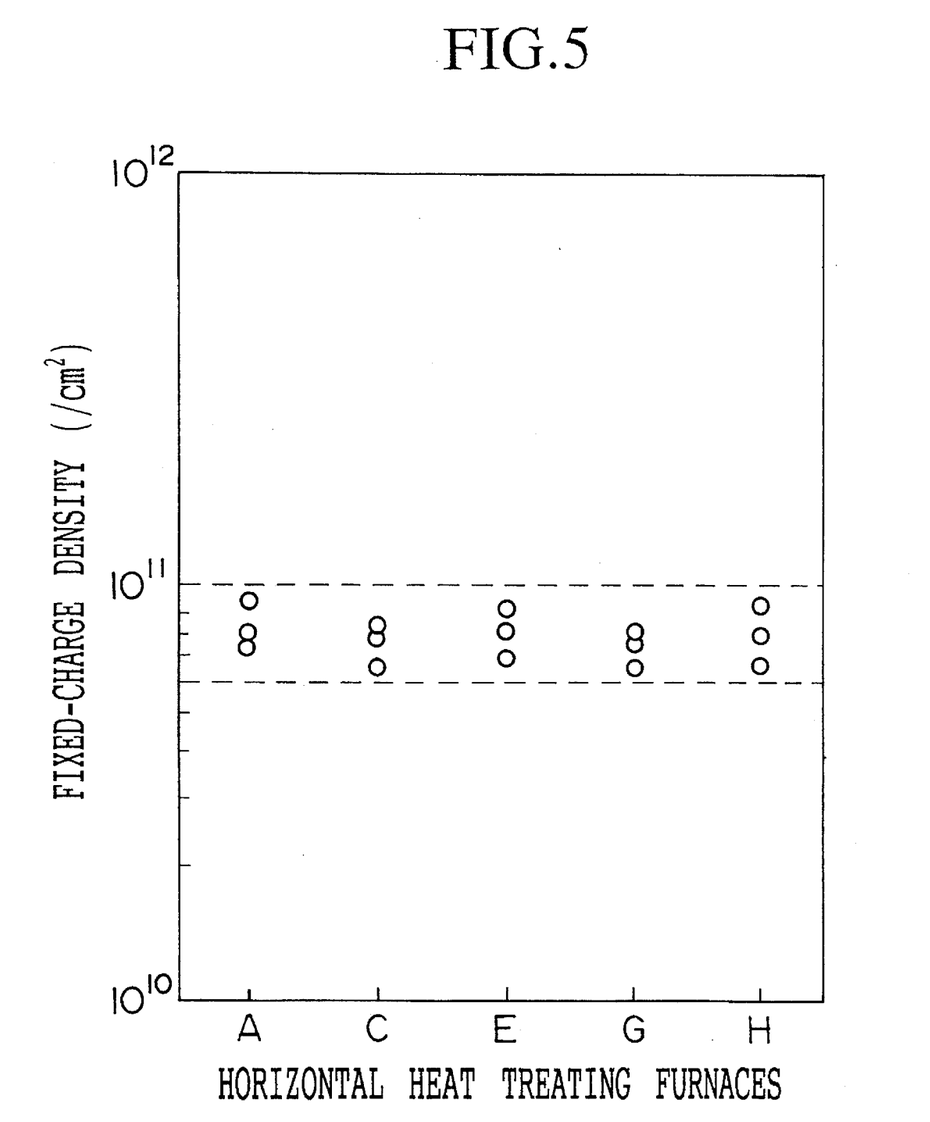
FIG. 5 shows a relation between five tubes of the heat treating furnaces with the different bores and fixed-charge densities under the condition of the TEST 2.

FIG. 5 shows a relation between five tubes of the heat treaing furnace with the different bores and fixed-charge densities in silicon oxide films. As seen in FIG. 5, once the 1st CLSs X and the 2nd CLS Y are determined so that the fixed-charge density is $1\times10^{11}/cm^2$ or less, all of the horizontal heat treating furnaces produce silicon oxide films of substantially the same fixed-charge density. In addition, the fixed-charge density is $(8\pm2)\times10^{10}/cm^2$ which well matches the results of TEST 1 (see FIG. 3).

The above embodiment controls the flow rates of the ambient gases by means of the gas feed system in order to control the 1st CLSs X and the 2nd CLS Y.

In an alternative embodiment of the present invention, dummy wafers with a diameter equal to or larger than the oxidized silicon wafers were placed at positions toward the opposite ends of the boat 3 in order to control the 1st CLSs X and the 2nd CLS Y by the ambient gases. The dummy wafer may be made of any suitable material, for example, quartz or silicon.

An alternative embodiment of the present invention employed a heat treating furnace tube whose inner diameter is approximate the diameter of the semiconductor wafer so that the CLS increases sufficiently large with a small amount of the ambient gas. That is, it is useful to choose the bore of the tube as small as possible. In this embodiment, the clearance as a element of the CLS is the area that insures the flow of the ambient gas in the tube.

In an alternative embodiment of the present invention, the temperature of the oxidation was 800°–900° C. The alternative embodiments had substantially the same results in respect to the fixed-charge density film as the embodiment described above.

The present invention is not rigidly restricted to the embodiments described above. It is to be understood that a person skilled in the art can easily change and modify the present invention without departing from the scope of the invention defined in the appended claims.

What is claimed is:

1. A process for manufacturing MOS devices from substantially disc-shaped semiconductor wafers, comprising the steps of:

providing a horizontal heat treating furnace, the horizontal heat treating furnace including a horizontal cylindrical tube with opposite open ends, holding means mounted within the tube for holding the semiconductor wafer in a vertical position transverse against the longitudinal axis of the tube, a gas feed system connected to one open end of the tube and feeding a flow of an oxidizing gas into the tube at an oxidizing step to produce an oxidizing ambient, the gas feed system feeding a flow of an annealing gas to the oxidized semiconductor wafer at an annealing step to produce an annealing ambient, and closing means removably mounted to the other open end of the tube for closing it, the closing means in a mounted position allowing a gas in the tube to flow outside the tube, the closing means in a removed position allowing the semiconductor wafer to be put into and taken out of the tube;

controlling first clearance linear speeds (1st CLSs) X which is the flows of the oxidizing and annealing gases defined as ratios of those flow rates to the area of a clearance between the semiconductor wafer and the interior surface of the tube to be at least 30 cm/min at the oxidizing and annealing steps;

controlling a second clearance linear speed (2nd CLS) Y which is the flow of the annealing gas defined as a ratio of that flow rate to the area of said clearance to be at least 100 cm/min throughout the duration of a step of taking the semiconductor wafer out of the tube; and controlling a relation between the 1st CLSs X and the 2nd CLS Y so that $Y \geq -2.5 X + 275$, wherein X, Y>0.

2. The process as recited in claim 1, wherein said first control step comprises the steps of controlling the flow rate of the oxidizing gas by means of the gas feed system to control the 1st CLS X as the oxidizing gas and controlling the flow rate of the annealing gas by means of the gas feed system to control the 1st CLS X as the annealing gas, and said second control step comprises a step of controlling the flow rate of the annealing gas by means of the gas feed system to control the 2nd CLS Y.

3. The process as recited in claim 1, wherein said first and second control steps comprise a step of mounting a substantially disc-shaped dummy wafer whose diameter is not smaller than the diameter of the semiconductor wafer to the holding means in a vertical position transverse against the longitudinal axis of the tube.

4. The process as recited in claim 2, wherein said first and second control steps comprise a step of mounting a substantially disc-shaped dummy wafer whose diameter is not smaller than the diameter of the semiconductor wafer to the holding means in a vertical position transverse against the longitudinal axis of the tube.

5. The process as recited in claim 1, wherein said first and second control steps comprise a step of choosing the bore of the tube whose inner diameter approximates the diameter of the semiconductor wafer.

6. The process as recited in claim 1, wherein the oxidizing gas comprises a wet oxygen and the annealing gas comprises nitrogen.

7. The process as recited in claim 1, wherein the oxidizing gas comprises a wet oxygen and the annealing gas comprises argon.

8. The process as recited in claim 1, wherein the oxidizing gas comprises a dry oxygen and the annealing gas comprises nitrogen.

9. The process as recited in claim 1, wherein the oxidizing gas comprises a dry oxygen and the annealing gas comprises argon.

10. The process as recited in claim 1, wherein the semiconductor wafer is a silicon wafer.

11. The process as recited in claim 3, wherein the dummy wafer is made of silicon.

12. The process as recited in claim 3, wherein the dummy wafer is made of quartz.

13. A process for manufacturing MOS devices from substantially disc-shaped semiconductor wafers, comprising the steps of:

providing a heat treating furnace, the horizontal heat treating furnace including a cylindrical tube having opposite open ends holding means mounted within the tube, for holding oxidized semiconductor wafer in a setting position transverse against the longitudinal axis of the tube, a gas feed system feeding a flow of an annealing gas to the oxidized semiconductor wafer at an annealing step to produce an annealing ambient, and closing means removably mounted to the other open end of the tube for closing it, the closing means in a mounted position allowing a gas in the tube to flow outside the tube, the closing means in a removed position allowing the semiconductor wafer to be put into and taken out of the tube;

controlling first clearance linear speed (1st CLS) X which is the flow of the annealing gas defined as a ratio of that flow rate to the area of a clearance between the semiconductor wafer and the interior surface of the tube to be at least 30 cm/min at the oxidizing and annealing steps;

controlling a second clearance linear speed (2nd CLS) Y which is the flow of the annealing gas defined as a ratio of that flow rate to the area of said clearance to be at least 100 cm/min throughout the duration of a step of taking the semiconductor wafer out of the tube; and controlling a relation between the 1st CLS X and the 2nd CLS Y so that $Y \geq -2.5 X + 275$, wherein X, Y>0.

14. The process as recited in claim 13, wherein said first control step comprises the steps of controlling the flow rate of the annealing gas by means of the gas feed system to control the 1st CLS X as the annealing gas, and said second control step comprises a step of controlling the flow rate of the annealing gas by means of the gas feed system to control the 2nd CLS Y.

15. The process as recited in claim 13, wherein said first and second control steps comprise a step of mounting a substantially disc-shaped dummy wafer, whose diameter is not smaller than the diameter of the semiconductor wafer, to the holding means in a vertical position transverse against the longitudinal axis of the tube.

16. The process as recited in claim 13, wherein said first and second control steps comprise a step of choosing the bore of the tube whose inner diameter approximates the diameter of the semiconductor wafer.

* * * * *